(12) United States Patent
Perry

(10) Patent No.: US 7,855,594 B2
(45) Date of Patent: Dec. 21, 2010

(54) FINE GAIN AND PHASE ADJUSTMENT OF ANALOG QUADRATURE FILTERS

(75) Inventor: Colin Leslie Perry, Wiltshire (GB)

(73) Assignee: Intel Corporation, Santa Clara, CA (US)

( * ) Notice: Subject to any disclaimer, the term of this patent is extended or adjusted under 35 U.S.C. 154(b) by 226 days.

(21) Appl. No.: 12/059,166

(22) Filed: Mar. 31, 2008

(65) Prior Publication Data

US 2009/0243811 A1     Oct. 1, 2009

(51) Int. Cl.
*H03B 1/00* (2006.01)
*H03K 5/00* (2006.01)
*H04B 1/10* (2006.01)

(52) U.S. Cl. ...................................... 327/552

(58) Field of Classification Search .................. 327/552
See application file for complete search history.

(56) References Cited

U.S. PATENT DOCUMENTS

| 4,168,440 | A  | * | 9/1979 | Gray ........................... 327/552 |
| 2006/0186952 | A1 | * | 8/2006 | Lou et al. .................... 327/553 |
| 2009/0066549 | A1 | * | 3/2009 | Thomsen et al. ............ 341/143 |

* cited by examiner

*Primary Examiner*—Lincoln Donovan
*Assistant Examiner*—Daniel Rojas
(74) *Attorney, Agent, or Firm*—Caven & Aghevli LLC

(57) ABSTRACT

Methods and apparatus to fine gain and/or phase adjustment of analog quadrature filters are described. In one embodiment, gain and/or phase of an analog quadrature filter may be digitally controlled by switching one or more resistors coupled to the quadrature filter. Other embodiments are also described.

14 Claims, 4 Drawing Sheets

US 7,855,594 B2

FINE GAIN AND PHASE ADJUSTMENT OF ANALOG QUADRATURE FILTERS

FIELD

The present disclosure generally relates to the field of electronics. More particularly, an embodiment of the invention generally relates to fine gain and/or phase adjustment of analog quadrature filters.

BACKGROUND

Quadrature filters may be used in various communication circuits. For example, a quadrature filter may be used as a band-pass filter, or as part of a poly-phase band-pass filter, removing low and high frequencies, but allowing frequencies within a range which includes the interesting components of the signal to pass. A quadrature filter may also be commonly used at baseband frequencies in a Zero-IF (Intermediate Frequency) receiver or transmitter architectures, where it may be implemented as two identical low pass filters, where each filter is driven with the same signal amplitude, but with typically 90° phase difference.

In some implementations, quadrature filters may be implemented as analog circuits (rather than digital circuits), for example, to provide faster response. To provide improved filtering, the gain and/or phase adjustment of quadrature filters may need to be finely tuned. However, fine gain and phase adjustment of analog quadrature filters can be difficult. Furthermore, if the quadrature gain and phase adjustment are not aligned to a high degree of accuracy the reception of certain modulation formats (such as 256 QAM (Quadrature Amplitude Modulation) constellation in accordance with International Telecommunications Union (ITU) J.83-A/B/C specification for cable modulation schemes used for transmission of digital video and audio for different geographies, e.g., used in cable television) will be seriously impaired.

For example, for a very fine adjustment, the change in value between components of the quadrature filter may be very small, and, as a result, may be less than the quoted mismatch of two (e.g., adjacently laid out) components of the quadrature filter. To make matters worse, when each component is switched in and out, the varying on-resistance between different switches may also worsen the problem.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Some embodiments allow for digitally controlled, time-stable, relatively very fine gain and/or phase adjustment of baseband analog quadrature filters. This may be especially useful if the final output interface requirement is at an intermediate frequency (IF) other than zero (where the baseband quadrature signal has been translated up in frequency), and/or if the technology and/or application limit the use of switch capacitor techniques (e.g., the fine adjustment of the clock frequency to one or more of the switched capacitor blocks (behaving as a resistor), which may not be trivial in terms of silicon area and complexity) and/or digital filtering (which may not be cost effective or add to the power consumption of the filters). Quadrature gain adjustment may be achieved by altering the relative gains of the quadrature I and Q (quadrature) paths. Quadrature output phase may be adjusted by adjusting the relative phase of the input signals to the quadrature I and Q paths.

In one embodiment, fine gain and/or phase adjustment may be provided such that it is stable over time and/or temperature variations, of the quadrature baseband signals in a silicon tuner. The silicon tuner may have an intermediate zero IF (Intermediate Frequency) containing integrated channel filters, one in each quadrature channel for example (see, e.g., FIG. 2). The signal may then be up converted (e.g., mixed back up) to an IF at the output. As previously discussed, if the quadrature gain and phase adjustment are not aligned to a high degree of accuracy, the reception of certain modulation formats (such as 256 QAM) may be seriously impaired. If the baseband signal were not to be up converted to an output IF (such that the baseband quadrature signals were directly fed in a digital baseband demodulator) the baseband demodulation may implement the quadrature gain and phase correction directly in an embodiment. Once the up conversion has occurred, the ability to correct quadrature gain and/or phase errors may be lost in some implementations.

Figure 1:
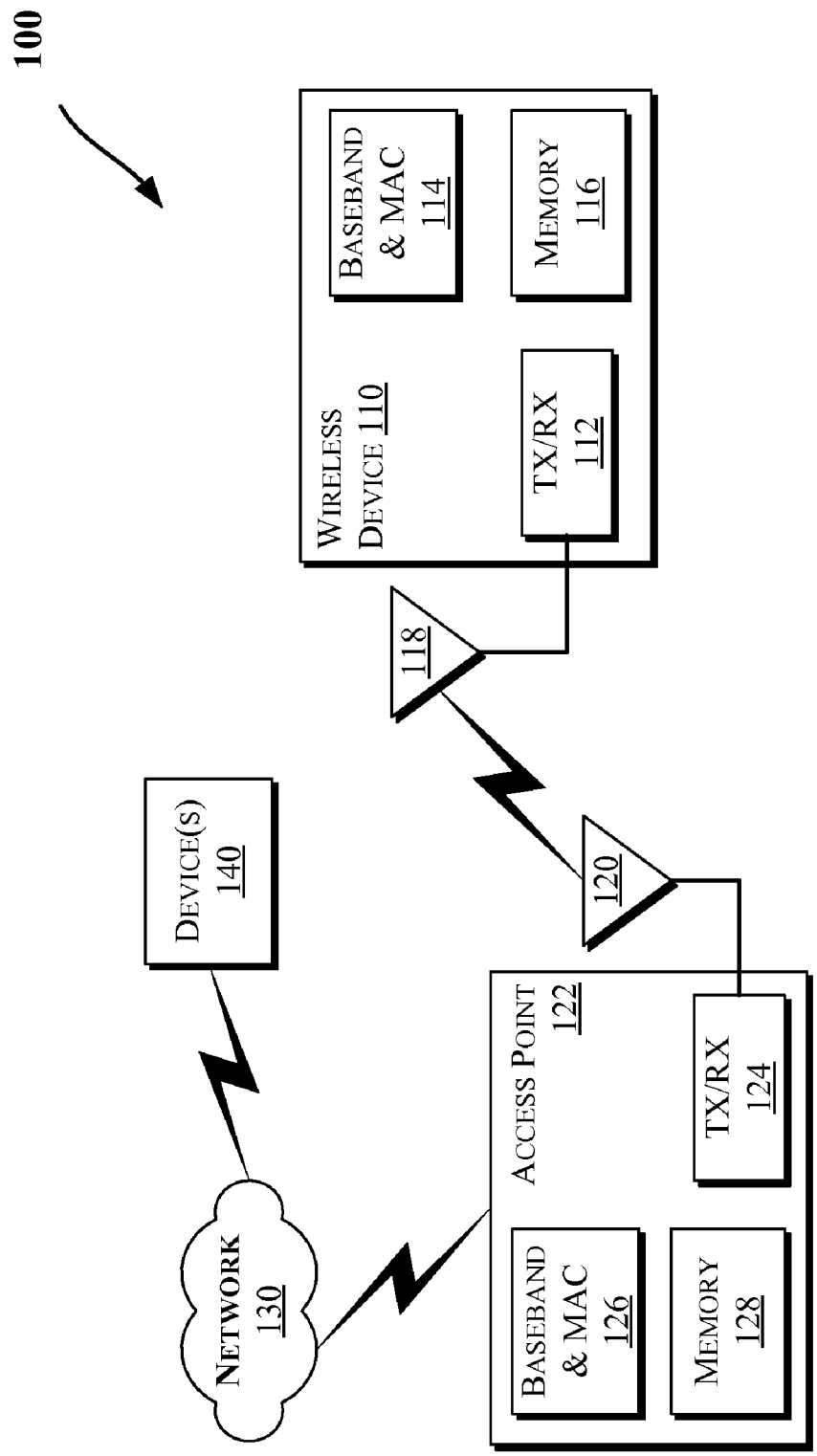
FIG. 1 illustrates various components of an embodiment of a communication system, which may be utilized to implement one or more embodiments.

Furthermore, some of the embodiments discussed herein may be implemented in various computing environments such as those discussed with reference to FIG. 1. More particularly, FIG. 1 is a block diagram of a wireless local area or cellular network communication system 100 in accordance with one or more embodiments of the invention will be discussed. In the communication system 100 shown in FIG. 1, a wireless device 110 may include a wireless transceiver 112 to couple to an antenna 118 and to a logic 114 such as a processor (e.g., to provide baseband and media access control (MAC) processing functions). In some embodiment, one or more devices such as a server computer, a desktop computer (e.g., a workstation or a desktop computer), a laptop (or notebook) computer, a reproduction device (e.g., a network printer, copier, facsimile, scanner, all-in-one device, etc.), a wireless access point, a personal digital assistant or smart phone, a rack-mounted computing system (not shown), etc. may include one or more of the components discussed with reference to the wireless device 110. Also, in an embodiment, the devices 140 may be the same or similar to the wireless device 110.

In one embodiment, the wireless device 110 may be a cellular telephone or an information handling system such as a mobile personal computer or a personal digital assistant or the like that incorporates a cellular telephone communication module. Logic 114 in one embodiment may comprise a single processor, or alternatively may comprise a baseband processor and an applications processor. Logic 114 may couple to a memory 116 which may include volatile memory such as dynamic random-access memory (DRAM), non-volatile memory such as flash memory, or alternatively may include other types of storage such as a hard disk drive. Some portion or all of memory 116 may be included on the same integrated circuit as logic 114, or alternatively some portion or all of memory 116 may be disposed on an integrated circuit or other medium, for example a hard disk drive, that is external to the integrated circuit of logic 114.

Wireless device 110 may communicate with access point 122 via a wireless communication link, (the link between the transmitter and receiver could also be a wired connection, including but not limited to cable TV coax or optical connection) where access point 122 may include one or more of: an antenna 120, a transceiver 124, a processor 126, and a memory 128. In some embodiments, the device 110 may directly communicate with other devices capable of wireless communication (e.g., having the same or similar components as discussed with reference to device 110), instead or in addition to communication via the access point 122. In one embodiment, access point 122 may be a base station of a cellular telephone network, and in an embodiment, access point 122 may be a an access point or wireless router of a wireless local or personal area network. In an embodiment, access point 122 (and optionally wireless device 110) may include two or more antennas, for example to provide a spatial division multiple access (SDMA) system or a multiple input, multiple output (MIMO) system. Access point 122 may couple with network 130, so that wireless device 110 may communicate with network 130, including devices coupled to network 130 (e.g., one or more of the devices 140), by communicating with access point 122 via a wireless communication link. Network 130 may include a public network such as a telephone network or the Internet, or alternatively network 130 may include a private network such as an intranet, or a combination of a public and a private network. Communication between wireless device 110 and access point 122 may be implemented via a wireless local area network (WLAN). In one embodiment, communication between wireless device 110 and access point 122 may be at least partially implemented via a cellular communication network compliant with a Third Generation Partnership Project (3GPP or 3G) standard. In some embodiments, antenna 118 may be utilized in a wireless sensor network or a mesh network.

Moreover, the network 130 may be any type of type of a computer network including an intranet, the Internet, and/or combinations thereof. The devices 140 may communicate with the network 130 through wired and/or wireless connections. Hence, the network 130 may be a wired and/or wireless network. Also, data communicated between the various devices may be encrypted (or cryptographically secured), e.g., to limit unauthorized access. The network 130 may utilize any communication protocol such as Ethernet, Fast Ethernet, Gigabit Ethernet, wide-area network (WAN), fiber distributed data interface (FDDI), Token Ring, leased line, analog modem, digital subscriber line (DSL and its varieties such as high bit-rate DSL (HDSL), integrated services digital network DSL (IDSL), etc.), asynchronous transfer mode (ATM), cable modem, and/or FireWire.

Wireless communication through the network 130 may be in accordance with one or more of the following: wireless local area network (WLAN), wireless wide area network (WWAN), code division multiple access (CDMA) cellular radiotelephone communication systems, global system for mobile communications (GSM) cellular radiotelephone systems, North American Digital Cellular (NADC) cellular radiotelephone systems, time division multiple access (TDMA) systems, extended TDMA (E-TDMA) cellular radiotelephone systems, third generation partnership project (3G) systems such as wide-band CDMA (WCDMA), etc. Moreover, network communication may be established by internal network interface devices (e.g., present within the same physical enclosure as a computing system) such as a network interface card (NIC) or external network interface devices (e.g., having a separate physical enclosure and/or power supply than the computing system to which it is coupled). Additionally, one or more components of the wireless device 110, access point 122, and/or device(s) 140 may include one or more of the quadrature filters discussed herein, e.g., with reference to FIGS. 2-5.

Figure 2:
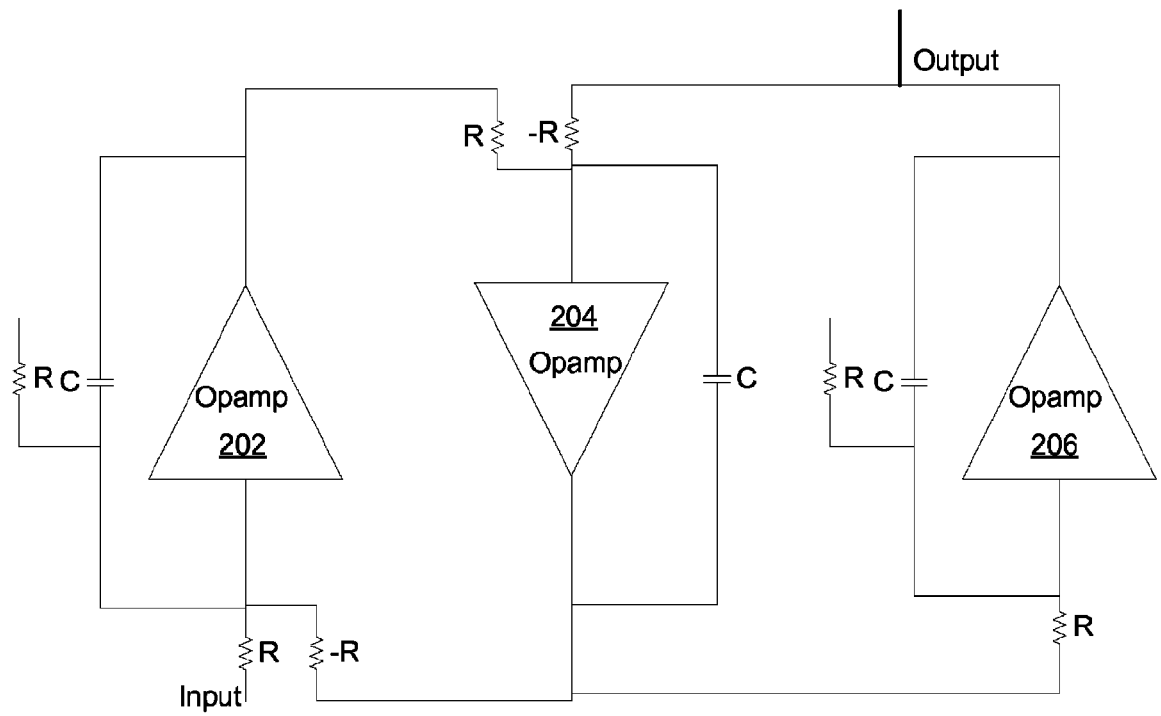
FIGS. 2-5 illustrate circuit diagrams, according to some embodiments.

FIG. 2 illustrates a circuit diagram of a third order low-pass ladder quadrature filter, accordingly to an embodiment. As shown in FIG. 2, the circuit may include three integrators 202, 204, and 206, which form three stages of a sample quadrature filter. As discussed herein, each stage of a quadrature filter may refer to an integrator (and potentially any resistors and/or capacitors coupled to that integrator). In some embodiments, the circuit may be implemented in a differential fashion (e.g., with each of the integrators 202-206 having at least two differential inputs). In FIG. 2, resistors are denoted by an "R" and capacitors are denoted by a "C". Moreover, the math to make the filter work means that the resistors labeled as "−R" are negative resistance. To make this a practical solution, using only real (positive R) in the type of filter implementation being shown (gm opamp C), one may consider that the filter will be implemented differentially in some embodiments and, as a result, the "+R" resistors labeled as "R" are implemented as resistors connected to the positive (non-inverting) amplifier input and the "−R" resistors shown in FIG. 2 are implemented as resistors connected to the negative (inverting) amplifier input.

In some embodiments, the integrators 202-206 may be operational amplifiers. Moreover, for reasons of power efficiency and/or dynamic range, the integrated channel filters shown in FIG. 2 may be implemented using one or more analogue GM (GM, usually written $g_m$, is an abbreviation for "transconductance") operational amplifier (or GM-OPAMP) integrator C arrangement, such as shown in FIG. 2. As discussed herein, the "C" is short for capacitor, where the filter pole positions are determined by the $g_m$ values and the C values. OPAMP is mentioned as it is possible to make a filter where the $g_m$ element directly drives a capacitor, with no OPAMP required, In some implementations, a source of any gain and quadrature imbalance may be any mismatch between two filters. It is possible to correct for gain and phase mismatch if the components associated with the filter poles could be adjusted. For example, with respect to the step size required to be able to meet the specification for 256 QAM, the step size requirement may be smaller than the process mismatch between two components in some embodiments. Also, if the filter time-constant resistors were adjusted, e.g., due to their size for the application in the 1 k-4 k region, the corresponding switch resistance and switch resistor mismatch may become significant. The peak phase correction step requirement may be about 0.3 degree and the differential gain step adjustment may be 0.1 dB (e.g., to be stable over time) in various embodiments. Some embodiments may provide for a monotonic adjustment.

In some embodiments, the stability over time and/or temperature (e.g., based on sensing of temperature data by one or more temperature sensors located in various locations in a circuit such as any components of figures) may be provided by a digitally controlled correction in an embodiment. For example, a logic (such as the processor 114 and/or 126 of FIG. 1) may be programmed in accordance with instructions stored in a computer-readable medium (such as the memory (s) 116 and/or 128) to digitally control correction of a quadrature filter provided in a device (such as any of the devices 110, 122, and/or 140, including for example the transceiver(s) 112 and/or 124).

Figure 4:
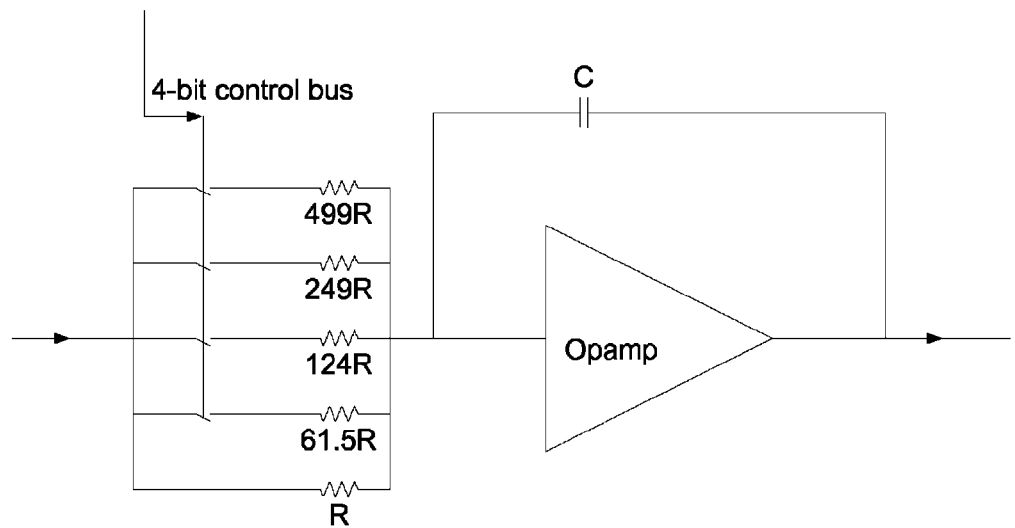
Figure 3:
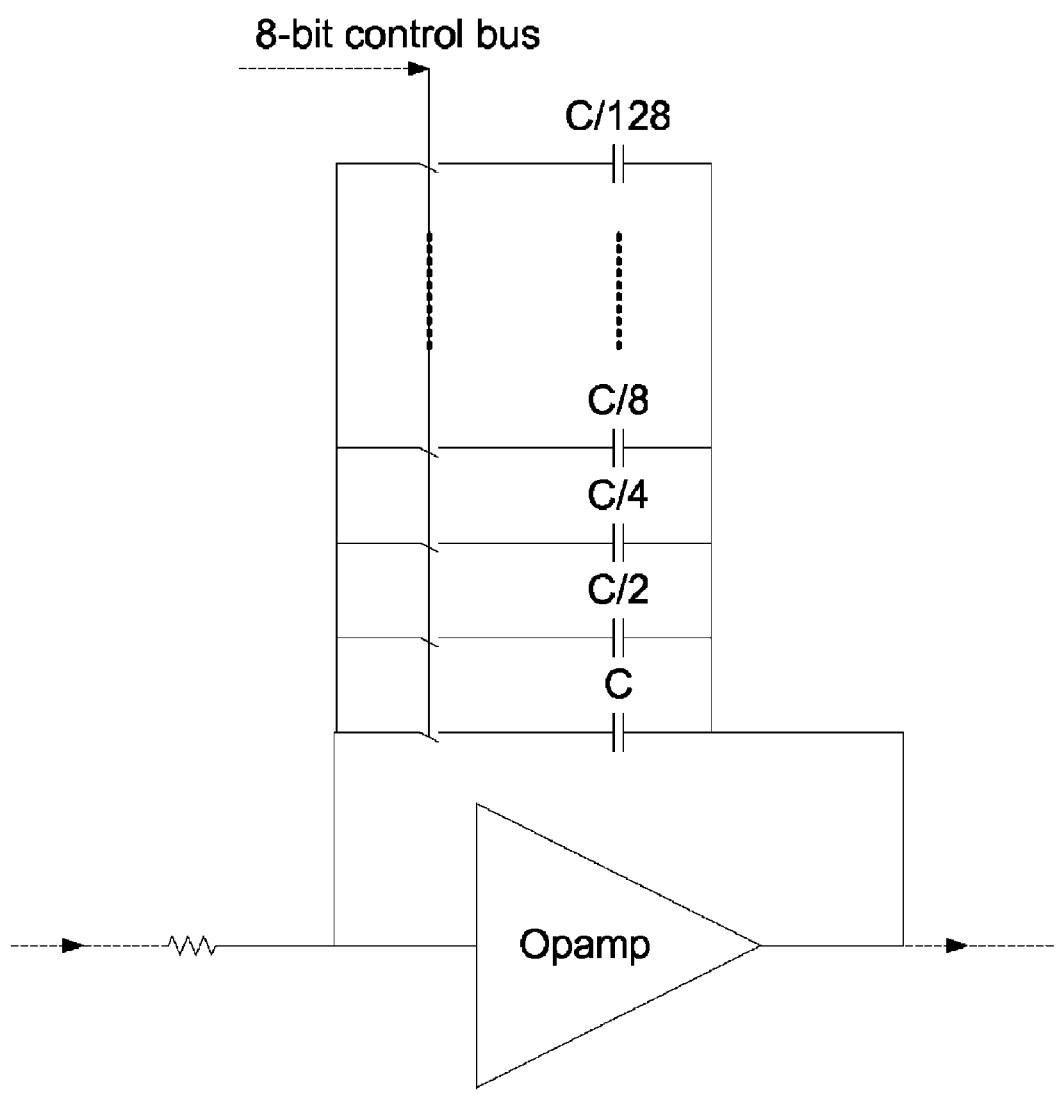
Figure 5:
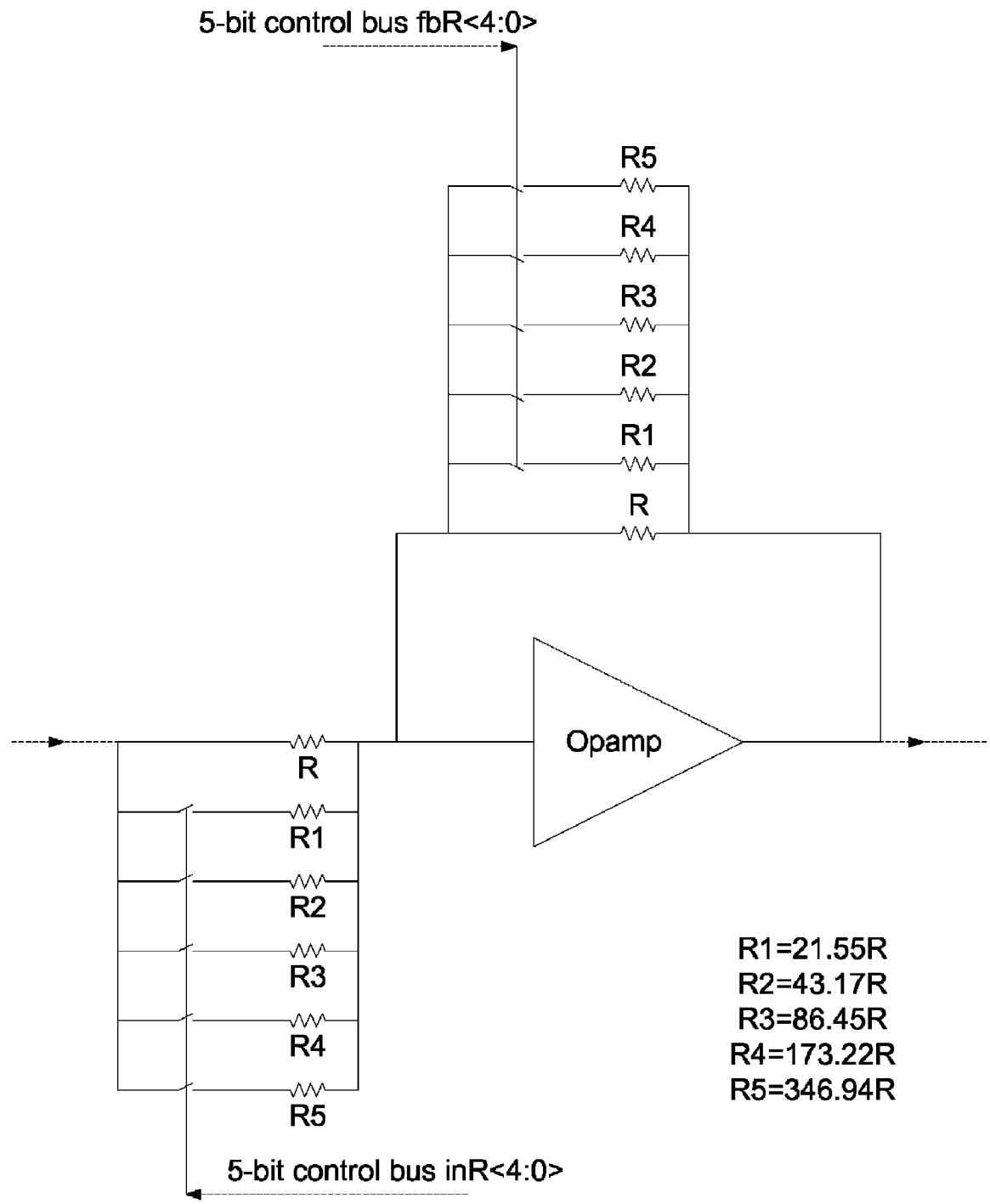

FIG. 3 illustrates a quadrature filter circuit capable of providing "coarse" tuning on a single integrator stage, according to an embodiment. FIG. 4 illustrates an embodiment of a quadrature filter circuit capable of "fine" tune implementation of one integrator stage, according to an embodiment. In some embodiments, the circuits of FIGS. 3-4 may be combined to provide both "coarse" and "fine" tuning. FIG. 5 illustrates a quadrature filter circuit capable of implementing fine gain steps, according to an embodiment. For example, the fine and/or coarse control of the integrators 202-206 of FIG. 2 may be performed by replacing corresponding resistors and/or capacitors of FIG. 2 with the parallel capacitor and/or resistor couplings shown with reference to the OPAMPS of FIGS. 3 and 4. Also, while FIGS. 3-5 illustrate components of a single integrator stage, similar components may be provided in more than one integrator stage (such as the circuit shown in FIG. 2).

Also, the fine and/or coarse control of the integrators 202-206 of FIG. 2 may be performed by replacing corresponding resistors and/or capacitors of FIG. 2 with the parallel resistor couplings shown with reference to the OPAMPS of FIG. 5. FIG. 5 also shows some sample values for R1 through R5 in accordance with at least one embodiment. Moreover, as shown in FIGS. 3-5, multiple bits of data (e.g., coupled to the resistors/capacitors through a bus) may be used to switch one or more resistors and/or capacitors in or out. For example, a logic (such as the processor 114 and/or 126 of FIG. 1) may be programmed in accordance with instructions stored in a computer-readable medium (such as the memory(s) 116 and/or 128) to digitally control the switching of one or more of the resistors and/or capacitors of each stage of a quadrature filter shown in FIGS. 3-5 in a device (such as any of the devices 110, 122, and/or 140, including for example the transceiver(s) 112 and/or 124). The number of resistors and/or capacitors shown in the figures is exemplary, i.e., more or less resistors and/or capacitors may be utilized in various embodiments.

Referring to FIGS. 1-5, the time constant setting resistor components in the filter shown in FIG. 2 may be finely adjusted, e.g., by having a single "low" value fixed resistor (for example, without switch) and then switching in relatively large resistors in parallel (e.g., such as shown in FIGS. 4 and 5, for example). This means that there may be no switch in series with the single "low" value switched resistor, eliminating this source of error. The large value resistors in parallel may be of the order of ×61.5, ×124, ×249 and ×499 larger than the "low" fixed value resistor in some embodiments, and therefore the associated switch resistance may be made insignificant. By adding larger resistors in parallel, the response may become monotonic (e.g., for step sizes that could not be monotonic if the change of resistor value was implemented just by switching between two very close in value resistors) as the switched in parallel resistors may be made significant larger in value than the fixed, "low" value non-switched, component. The techniques discussed herein may be equally applicable for the fine adjustment of the resistors in an operational amplifier (OPAMP) resistive feedback amplifier, such as utilized in baseband I and Q (quadrature) paths, to implement fine gain adjustment. An additional benefit of such techniques is that their provision does not significantly add to the power consumption of the filter and/or gain adjustment amplifiers.

In various embodiments of the invention, the operations discussed herein, e.g., with reference to the figures, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed herein. Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A quadrature filter comprising:
    an integrator to receive an input signal at an input node and generate an output signal at an output node;
    a fixed resistor coupled to the integrator;
    a plurality of resistors coupled to the fixed resistor in parallel, wherein a value of the fixed resistor is lower than a value of any of the plurality of resistors; and
    a plurality of switches, wherein each of the plurality of switches is coupled in series to at least one of the plurality of resistors, wherein: an output node of the integrator is to be coupled to an input node of a second integrator, an output node of the second integrator is to be coupled to an input node of the integrator and an input node of a third integrator, and an output node of the third integrator is to be coupled to the output node, the input node of the second integrator, and the output node of the integrator.

2. The filter of claim 1, wherein the plurality of switches selectively couple one or more of the plurality of resistors to the integrator to cause an adjustment to the output signal.

3. The filter of claim 1, wherein the input signal is filtered by the quadrature filter in accordance with the value of the fixed resistor and a value of any of the plurality of resistors that are electrically coupled to the integrator.

4. The filter of claim 1, wherein the integrator comprises an operational amplifier.

5. The filter of claim 1, wherein the fixed resistor and the plurality of resistors are coupled in parallel to the input node and the output node of the integrator.

6. The filter of claim 1, wherein the fixed resistor and the plurality of resistors are coupled in series to the input node of the integrator.

7. The filter of claim 1, wherein each of the plurality of resistors has a different value.

8. The filter of claim 1, further comprising an antenna coupled to the input node, wherein the antenna is to generate the input signal.

9. The filter of claim 1, further comprising a bus coupled to the plurality of switches to selectively cause one or more of the plurality of switches to open or close.

10. The filter of claim 1, wherein a processor is to receive the output signal.

11. The filter of claim 1, further comprising:
a fixed capacitor coupled in parallel to the input node and the output node of the integrator;
a plurality of capacitors coupled to the fixed capacitor in parallel; and
a plurality of switches, wherein each of the plurality of switches is coupled in series to at least one of the plurality of capacitors, wherein the input signal is filtered by the quadrature filter in accordance with the value of the fixed capacitor and a value of any of the plurality of capacitors that are electrically coupled to the integrator.

12. A computer-readable medium comprising one or more instructions that when executed on a processor configure the processor to:
to digitally control switching of one or more resistors coupled to each stage of a multi-stage quadrature filter, wherein the one or more resistors comprise:
a fixed resistor coupled to an integrator; and
a plurality of resistors coupled to the fixed resistor in parallel, wherein a value of the fixed resistor is lower than a value of any of the plurality of resistors, wherein the multi-stage quadrature filter is to comprise a first integrator, a second integrator, and a third integrator, wherein: an output node of the first integrator is to be coupled to an input node of the second integrator, an output node of the second integrator is to be coupled to an input node of the first integrator and an input node of the third integrator, and an output node of the third integrator is to be coupled to the input node of the second integrator, and the output node of the first integrator.

13. The medium of claim 12, further comprising one or more instructions that when executed on the processor configure the processor to digitally control switching of one or more capacitors coupled to each stage of a multi-stage quadrature filter, wherein the one or more capacitors comprise:
a fixed capacitor coupled in parallel to the integrator; and
a plurality of capacitors coupled to the fixed capacitor in parallel.

14. The medium of claim 12, further comprising one or more instructions that when executed on the processor configure the processor to cause transmission of a plurality of bits over a bus to digitally control the switching of the one or more resistors.

* * * * *